(12) United States Patent  
Gorbachov

(10) Patent No.: US 7,576,626 B2  
(45) Date of Patent: *Aug. 18, 2009

(54) DIRECTIONAL COUPLERS FOR RF POWER DETECTION

(75) Inventor: Oleksandr Gorbachov, Catania (IT)

(73) Assignee: STMicroelectronics Ltd., Hong Kong (HK)

( * ) Notice: Subject to any disclaimer, the term of this patent is extended or adjusted under 35 U.S.C. 154(b) by 0 days.

This patent is subject to a terminal disclaimer.

(21) Appl. No.: 12/208,960

(22) Filed: Sep. 11, 2008

(65) Prior Publication Data

US 2009/0009260 A1 Jan. 8, 2009

Related U.S. Application Data

(62) Division of application No. 11/530,220, filed on Sep. 8, 2006, now Pat. No. 7,446,626.

(51) Int. Cl.  
*H01P 5/18* (2006.01)

(52) U.S. Cl. .................. 333/112; 333/108; 333/118

(58) Field of Classification Search .............. 333/112, 333/109, 118  
See application file for complete search history.

(56) References Cited

U.S. PATENT DOCUMENTS

| 4,042,887 | A | * | 8/1977 | Mead et al. .................. 330/53 |
| 5,530,922 | A | * | 6/1996 | Nagode .................. 455/126 |
| 6,064,872 | A | * | 5/2000 | Vice .................. 455/326 |
| 6,239,668 | B1 | * | 5/2001 | Menna et al. .................. 333/25 |
| 6,496,708 | B1 | * | 12/2002 | Chan et al. .................. 455/553.1 |
| 2003/0078037 | A1 | * | 4/2003 | Auckland et al. .................. 455/422 |
| 2004/0045957 | A1 | * | 3/2004 | Openlander .................. 219/678 |

OTHER PUBLICATIONS

Koutsoyannopoulos, Yorgos K., Systematic Analysis and Modeling of Integrated Inductors and Transformers in RF IC Design, IEEE Transactions on Circuits and systems-II Analog and Digital Signal Processing, vol. 47, N. 8, Aug. 2000, pp. 699-713.

Lakdawala, Hasnain, et al., Micromachined High-Q Inductors in a 0.18-μm Copper Interconnect Low-K Dielectric CMOS Process, IEEE Journal of Solid-State Circuits, vol. 37, No. 3, Mar. 2002, pp. 394-404.

Yim, Seong-Mo, The Effects of a Ground Shield on the Characteristics and Performance of Spiral Inductors, IEEE Journal of Solid-State Circuits, vol. 37, No. 2, Feb. 2002, pp. 237-244.

Bahl, Inder J., Improved Quality Factor Spinal Inductors on GaAs Substrates, IEEE Microwave and Guided Wave Letters, vol. 9, No. 10, Oct. 1999, pp. 398-400.

(Continued)

*Primary Examiner*—Jean B Jeanglaude  
(74) *Attorney, Agent, or Firm*—Lisa K. Jorgenson; William J. Kubida

(57) ABSTRACT

Very small size true directional couplers have a coupling coefficient that is independent on load VSWR. The coupler uses coupled inductors with a compensation circuit including a resistor and a capacitor, or just a capacitor. Wideband operation is suitable for many portable applications such as power detection and control for GSM, DCS-PCS, CDMA/WCDMA, Bluetooth, and WLAN systems.

20 Claims, 12 Drawing Sheets

OTHER PUBLICATIONS

Vo, V.T., et al., Design and Realization of CPW Multilayer Couplers for Broadband Applications, 2nd EMRS DTC Technical Conference—Edinburg 2005, p. 6.

Park, Min, The Detailed Analysis of High Q CMOS-Compatible Microwave Spiral Inductors in Silicon Technology, IEEE Transactions of Electron Devices, vol. 45, No. 9, Sep. 1998, pp. 1953-1959.

Tang, Chih-Chun, Miniature 3-D Inductors in Standard CMOS Process, IEEE Journal of Solid-State Circuits, vol. 37, No. 4, Apr. 2002, pp. 471-480.

Vanersteen, Gerd, et al., Broadband High Frequency Differential Couple, IEEE Instrumentation and Measurement Technology Conference, Budapest, Hungary, May 21-23, 2001, p. 6.

Haji-Michael, Chris, Values for Discrete Component Coupler, http://www.sunshadow.co.uk/chris.htm, p. 1.

Haji-Michael, Chris, Values for Discrete Component Branch Line Coupler (Type-2), http://www.sunshadow.co.uk/chris.htm, p. 1.

Jahi-Michael, Chris, Values for Discrete Component Branch Line Coupler (Type-1), http://www.sunshadow.co.uk/chris.htm, p. 1.

Kamogawa, Kenji, et al., A Novel High-Q Inductor Based on Si 3D MMIC Technology and Its Application, 1999 IEEE, 4 pgs.

Soorapanth, Theerachet, et al., A 0-dB IL 2140±30 MHz Bandpass Filter Utilizing Q-Enhanced Spiral Inductors in standard CMOS, IEEE Journal of Solid-State Circuits, vol. 37, No. 5, May 2002, pp. 579-586.

Johanson Technology, Inc., High Frequency Ceramic Solutions, www.johansontechnology.com, Jan. 22, 2003, 2 pgs.

Electromagnetic Problems, No Date, pp. 1-13.

Sachse, Krzysztof, et al., Quasi-Ideal Multilayer Two- and Three-Strip Directional Couplers for Monolithic and Hybrid MIC's, IEEE Transactions on Microwave Theory and Techniques, vol. 47, No. 9, Sep. 1999, pp. 1873-1882.

Zhoou, JianJun J., et al., Monolithic Transformers and Their Application in a Differential CMOS RF Low-Noise Amplifier, IEEE Journal Of Solid-State Circuits, vol. 33, No. 12, Dec. 1998, pp. 2020-2027.

Long, John R., Monolithic Transformers for Silicon RF IC Design, IEEE Journal of Solid-State Circuits, vol. 35, No. 9, Sep. 2000, pp. 1368-1382.

Yue, C. Patrick, et al., Physical Modeling of Spiral Inductors on Silicon, IEEE Transactions on Electron Devices, vol. 47, No. 3, Mar. 2000, pp. 560-568.

Settaluri, Raghu K., et al., Design of Compact Multilevel Folded-Line RF Couplers, IEEE Transactions on Microwave Theory and Techniques, vol. 47, No. 12, Dec. 1999, pp. 2331-2339.

Park, Min, et al., Frequency-Dependent Series Resistance of Monolithic Spiral Inductors, IEEE Microwave and Guided Wave Letters, vol. 9, No. 12, Dec. 1999, pp. 514-516.

Niknejad, Ali M., et al., Analysis, Design, and Optimization of Spiral Inductors and Transformers for Si RF IC's, IEEE Journal of Solid-State Circuits, vol. 33, No. 10, Oct. 1998, pp. 1470-1481.

Yue, C. Patrick, et al., On-Chip Spiral Inductors with Patterned Ground Shields for Si-Based RF IC's, IEEE Journal of Solid-State Circuits, vol. 33, No. 5, May 1998, pp. 743-752.

Burghartz, Joachim N., et al., RF Circuit Design Aspects of Spiral Inductors on Silicon, IEEE Journal of Solid-State Circuits, vol. 33, No. 12, Dec. 1998, pp. 2028-2034.

Zolfaghari, Alireza, et al., Stacked Inductors and Transformers in CMOS Technology, IEEE Journal of Solid-State Circuits, vol. 36, No. 4, Apr. 2001, pp. 620-628.

Ellis, Michael G., RF Directional Couplers, pp. 1-8.

* cited by examiner

DIRECTIONAL COUPLERS FOR RF POWER DETECTION

RELATED APPLICATION

The present application claims priority from, and is a divisional of, U.S. patent application Ser. No. 11/530,220 filed on Sep. 8, 2006, the disclosure of which is herein specifically incorporated in its entirety by this reference.

BACKGROUND OF THE INVENTION

The present invention relates to directional couplers used in RF applications.

Directional couplers are used in many different RF applications such as power detection and control, test and measurement, mobile phones, and many others.

Numerous types of couplers are known in the art. Microstrip, strip-line, Lange-couplers and other directional couplers require a large size to obtain a reasonable coupling coefficient and low insertion loss over a wide frequency range. Consequently, this type of coupler increases total size and cost of, for example, mobile devices. L-C couplers used in current power detection applications (GSM, CDMA, WLAN, Bluetooth, etc.) are not "true" directional couplers, and the coupling coefficient depends on a standing wave at the output (load VSWR dependent) resulting in incorrect power measurement and control. On-die implementation of microstrip and other types of directional couplers is limited by high-frequency applications (microwave and millimeter-wave). The geometry of the coupler is directly proportional to the wavelength of the signal to be detected.

What is desired, therefore, is a true directional coupler for RF applications that can be manufactured with a small geometry and at low cost.

SUMMARY OF THE INVENTION

According to the present invention, a very small size "true" directional coupler has a coupling coefficient that is independent on load VSWR. The coupler uses coupled inductors with a compensation circuit including a resistor and a capacitor, or just a capacitor. The coupler can be made so that its area is more than ten times smaller than that of existing couplers. Wideband operation is suitable for many portable applications such as power detection and control for GSM, DCS-PCS, CDMA/WCDMA, Bluetooth, WLAN systems, and the like. The directional coupler of the present invention is easy and inexpensive to fabricate and can be manufactured using integrated circuits, printed circuit boards, low temperature co-fired ceramic implementations, or micro electro-mechanical systems ("MEMS"). A wide range of coupling coefficients can be realized by adjustment of the coupled inductance and the compensation circuit parameters. The coupler of the present invention has low insertion loss, and the coupling coefficient and insertion loss are tolerant to process and geometry variations. A small ballast resistor does not require large power dissipation over load VSWR variation. Optimal (minimum coupling between the load port and the coupling port) compensation capacitance is linearly dependent (positive slope) on the inductance coupling coefficient at a fixed inductance value and resistive loss. Optimal compensation capacitance is linearly dependent (negative slope) on inductance resistive loss at a fixed inductance value and coupling coefficient. Optimal compensation capacitance is linearly dependent (positive slope) on coupled inductance at fixed inductance resistive loss value and coupling coefficient.

A first embodiment of the RF coupler according to the present invention includes an input port, a coupling port, a load port, a ballast resistor port, a compensation circuit coupled between the input port and the coupling port, and a coupled inductor having a first terminal coupled to the input port, a second terminal coupled to the coupling port, a third terminal coupled to the load port, and a fourth terminal coupled to the ballast resistor port.

A second embodiment of the RF coupler according to the present invention includes a GSM input port, a power detector port, a DCS-PCS input port, a GSM output port, a ballast resistance port, a DCS-PCS output port, a first compensation circuit coupled between the GSM input port and the power detector port, a second compensation circuit coupled between the power detector port and the DCS-PCS input port, and a coupled inductor having a first terminal coupled to the GSM input port, a second terminal coupled to the power detector port, a third terminal coupled to the DCS-PCS input port, a fourth terminal coupled to the GSM output port, a fifth terminal coupled to the ballast resistance port, and a sixth terminal coupled to the DCS-PCS output port.

A third embodiment of the RF coupler includes an input port, a power detector port, an output port, a ballast resistor port, a compensation circuit coupled between the input port and the power detector port, a coupled inductor having a first terminal coupled to the input port, a second terminal coupled to the power detector port, a third terminal, and a fourth terminal coupled to the ballast resistor port, a shunt resistor coupled between the third terminal of the coupled inductor and ground, and a series resistor coupled between the third terminal of the coupled inductor and the output port.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DETAILED DESCRIPTION OF THE INVENTION

Figure 1:
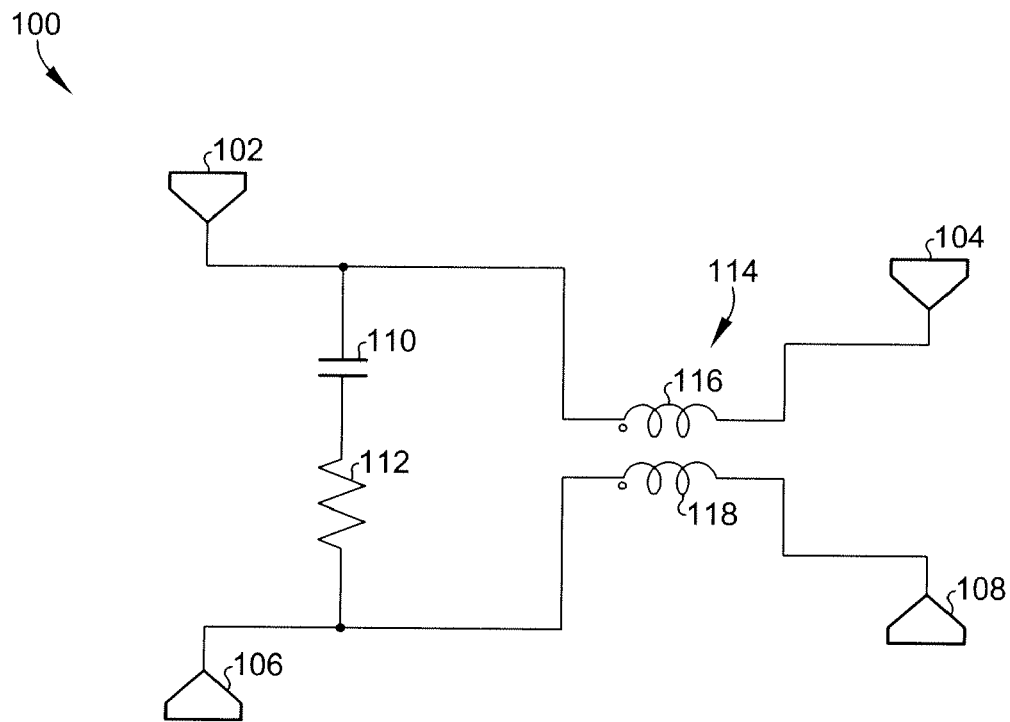
FIG. 1 is a schematic diagram of a true directional coupler circuit according to the present invention.

Referring now to FIG. 1, an RF coupler circuit 100 includes an input port 102, a coupling port 106, a load port 104, a ballast resistor port 108, a compensation circuit 110, 112 coupled between the input port and the coupling port, and a coupled inductor 114 having a first terminal coupled to the input port 102, a second terminal coupled to the coupling port 106, a third terminal coupled to the load port 104, and a fourth terminal coupled to the ballast resistor port 108. The coupled inductor 114 includes first and second inductors 116 and 118.

In a typical example optimized for wideband (0.8-6 GHz) operation, the inductance of the first and second inductors 116 and 118 is 0.6 nH. The series resistance for the first and second inductors is 1.2 ohms and the coupling coefficient between inductors 116 and 118 is about 0.7. The compensation circuit for coupler 100 includes a resistor 112 in series with a capacitor 110. The resistance of resistor 112 is 21.4 ohms. The capacitance of capacitor 110 is 0.164 pF.

Figure 2:
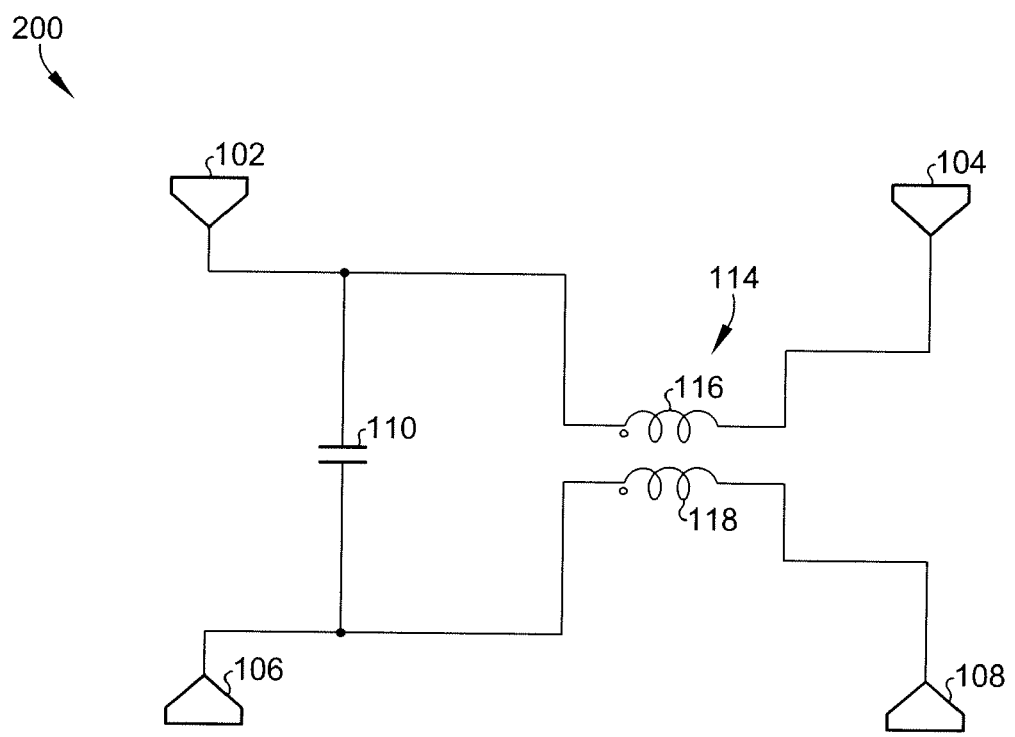
FIG. 2 is a schematic diagram of a simplified true directional coupler circuit according to the present invention.

A simplified true directional coupler 200 is shown in FIG. 2. Note that the compensation circuit includes only capacitor 110, whose value is 0.164 pF in a typical example.

Figure 3:
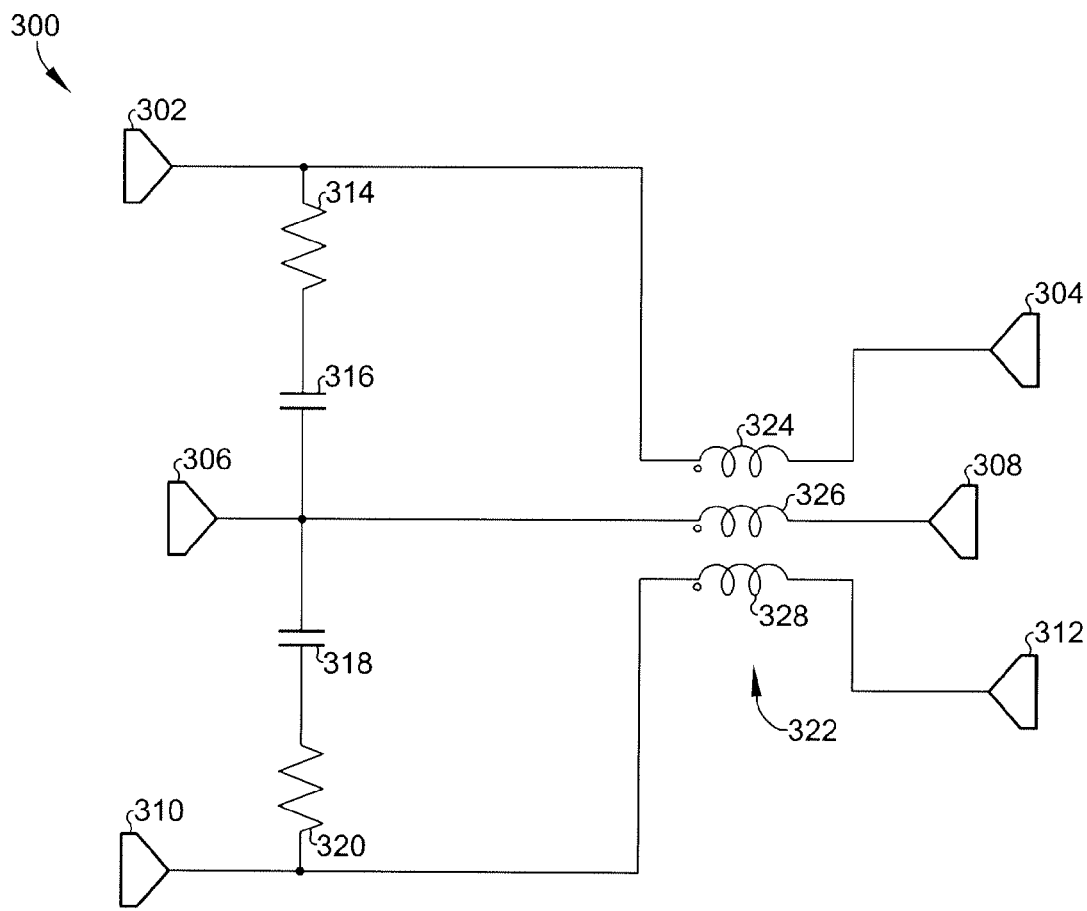
FIG. 3 is a schematic diagram of a quad-band GSM directional coupler circuit according to the present invention.

A quad-band GSM directional coupler is shown in FIG. 3 including a GSM input port 302, a power detector port 306, a DCS-PCS input port 310, a GSM output port 304, a ballast resistance port 308, a DCS-PCS output port 312, a first compensation circuit 314, 316 coupled between the GSM input port 302 and the power detector port 306, a second compensation circuit 318, 320 coupled between the power detector port 306 and the DCS-PCS input port 310, a coupled inductor 322 having a first terminal coupled to the GSM input port 302, a second terminal coupled to the power detector port 306, a third terminal coupled to the DCS-PCS input port 310, a fourth terminal coupled to the GSM output port 304, a fifth terminal coupled to the ballast resistance port 308, and a sixth terminal coupled to the DCS-PCS output port 312. The coupled inductor 322 includes first, second, and third inductors 324, 326, and 328.

In a typical example optimized for GSM, DCS and PCS (0.8-1.9 Ghz) operation, the inductance of the first, second, and third inductors 324, 326, and 328 is 1.2 nH. The series resistance for the first, second, and third inductors is two ohms. The coupling coefficient between the first and second inductors is about 0.7. The coupling coefficient between the second and third inductors is about 0.7. The coupling coefficient between the first and third inductors is about 0.5. The first compensation circuit for coupler 300 includes a resistor 314 in series with a capacitor 316. The resistance of resistor 314 is 21.5 ohms. The capacitance of capacitor 316 is 0.325 pF. The second compensation circuit for coupler 300 includes a resistor 320 in series with a capacitor 318. The resistance of resistor 320 is 21.5 ohms. The capacitance of capacitor 318 is 0.325 pF. If desired, the compensation circuits can include only a single capacitor.

Figure 4:
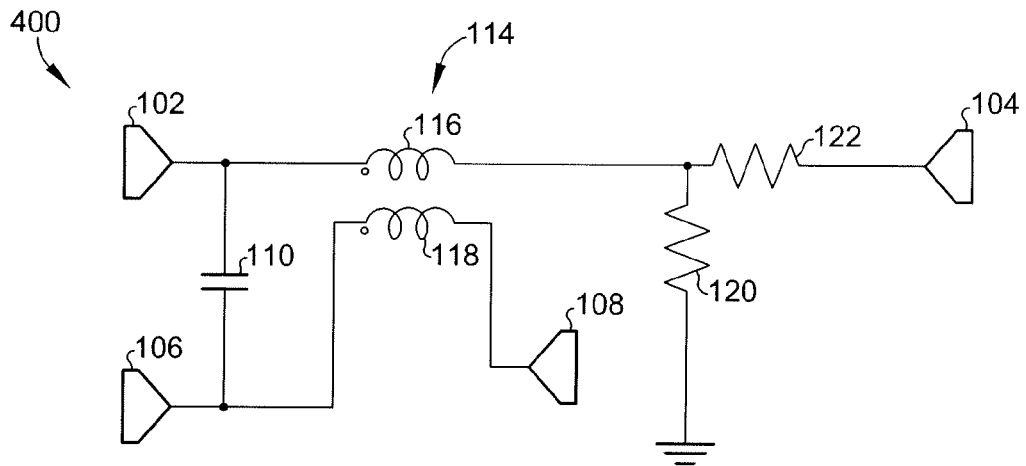
FIG. 4 is a schematic diagram of a directional coupler circuit having an enhanced load VSWR tolerant capability according to the present invention.

Referring now to FIG. 4, an RF coupler 400 having enhanced load VSWR tolerant capability includes an input port 102, a power detector port 106, an output port 104, a ballast resistor port 108, a compensation circuit 110 coupled between the input port 102 and the power detector port 106, a coupled inductor 114 having a first terminal coupled to the input port 102, a second terminal coupled to the power detector port 106, a third terminal, and a fourth terminal coupled to the ballast resistor port 108, a shunt resistor 120 coupled between the third terminal of the coupled inductor 114 and ground, and a series resistor coupled between the third terminal of the coupled inductor 114 and the output port 104. The coupled inductor 114 includes first and second inductors 116 and 118.

In a typical example optimized for GSM, DCS, and PCS (0.8-1.9 GHz) operation, the inductance of the first and second inductors 116 and 118 is 1.2 nH. The series resistance for the first and second inductors is 2.4 ohms and the coupling coefficient between first and second inductors 116 and 118 is about 0.7. The compensation circuit for coupler 400 includes a capacitor 110 whose value is 0.33 pF. The value of the shunt resistor is 500 ohms, and the value of the series resistor is 3 ohms.

Figure 5:
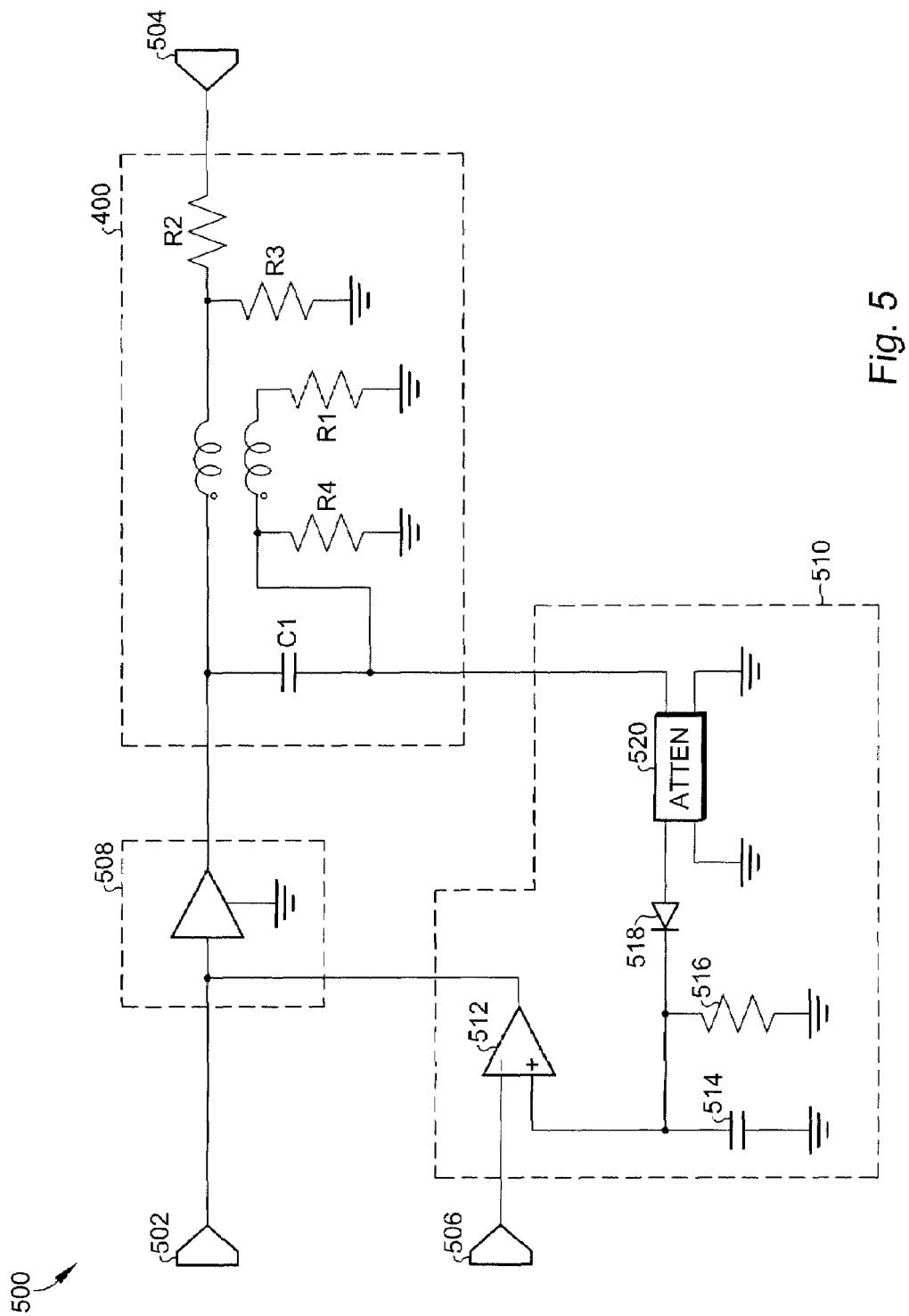
FIG. 5 is a schematic diagram of a GSM power amplifier architecture with power control and enhanced load VSWR tolerance according to the present invention.

Referring now to FIG. 5, a GSM power amplifier architecture 500 is shown using the directional RF coupler of the present invention. Power amplifier architecture 500 includes a main GSM power amplifier block 508 having an output coupled to an RF coupler 400 as is previously described. RF coupler 400 is also coupled to the RF output port 504. A power detector and control block 510 is coupled to the control port 506, to the GSM power amplifier block 508, and to the RF coupler 400. Power detector and control block 510 includes an error amplifier 512, parallel capacitor 514 and resistor 516, diode 518, and an attenuator 520.

Figure 6:
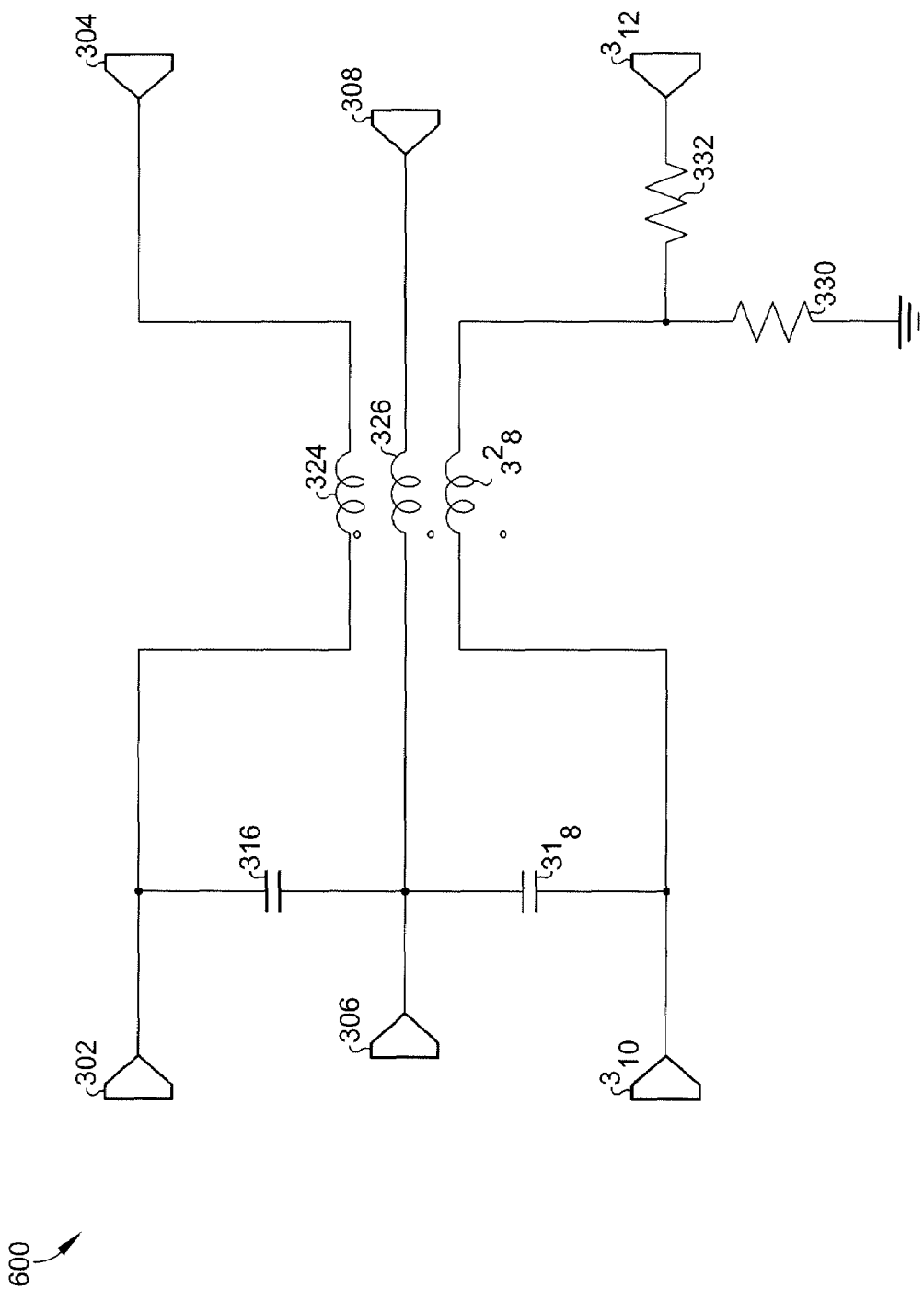
FIG. 6 is a schematic diagram of a quad-band GSM directional coupler circuit having an enhanced load VSWR tolerant capability according to the present invention.

Referring now to FIG. 6, a quad-band GSM directional coupler is shown as previously described with respect to FIG. 3. In addition to the previously described circuit components, coupler 600 includes a shunt resistor 330 and a series resistor 332 associated with GSM output port 312. If desired, these resistors can also be associated with DCS-PCS output port 304, or with both ports.

The following description refers to a detailed methodology for selecting the component values for the couplers of FIGS. 1-6 according to the present invention. Following a description of the methodology, the performance of the couplers of the present invention is set forth in FIGS. 7-11.

After an appropriate technology is chosen, the design procedure uses high-frequency EM (electro-magnetic) and circuit simulation software—examples of which are AWR Microwave Office, Agilent ADS, and the like. As an initial matter the metal trace width and thickness of the coupled inductors should be chosen, which is dependent on RF power handling capability of the main signal path (input port to output port). This information can be found in appropriate design rules of the particular technology chosen. As a rule, the wider and thicker the metal trace, the lower the insertion loss. The longer the metal trace, the higher the insertion loss. The inductor value is also dependent on proximity to other metal planes (such as ground) and other traces. All of these influences are fairly well developed by existing simulation software tools.

Next, the inductance of the coupled inductors should be chosen. This inductance directly defines the final coupling coefficient between input port and coupled port of a coupler.

As a rule of thumb, the higher the inductance value, the lower (in dB) the coupling coefficient. Coupling between the input port and the coupled port is also dependent on the coupling coefficient between coupled inductors. A higher coupling coefficient between the inductors results in a lower (in dB) coupling between input port and coupled port. The coupling coefficient between inductors is dependent on the distance between the two coils, and as a rule the longer the distance, the lower the coupling. Particular implementation of a coupled inductors' technology defines coupling and can be found in existing EM and circuit simulation software. For instance, simulating by EM software a particular coupled inductors' structure and then comparing with circuit simulation can give the correct value of coupling between the coils.

Next, the compensation capacitor value should be chosen. The compensation capacitor value can be tuned in a circuit simulation until the minimum coupling between the output port and the coupled port is achieved (all ports should be loaded by 50 ohms). Verify if the coupling coefficient between the input port and the coupled port has the desired value. If not, change the inductor value and repeat the simulation. When the desired coupling coefficient is achieved, add a compensation resistor in the circuit and tune this resistance value in the circuit simulator until the minimum coupling between the output port and the coupled port is achieved. The adding of the compensation resistor almost always does not change the coupling between the input port and the coupled port.

The difference between the basic coupler with the compensation capacitor and the compensation resistor and the simplified coupler with just the compensation capacitor is in the minimum coupling value between the output port and the coupled port. The basic coupler has an advantage in this coupling (see appropriate simulation results below) although the simplified coupler has an advantage in implementation (compensation resistor is not necessary) and size.

The placement and positioning of coupled inductors along with compensation capacitors and resistors is very flexible and it can be chosen as appropriate for a particular design. Referring to FIGS. 1-3, compensation circuits comprising a capacitor and resistor or just a capacitor can be inserted between the output port and the ballast resistor port instead of as shown in the originally proposed circuits. If desired, the compensation circuits can be inserted at the input and the output simultaneously. In both cases mentioned above a simulation should be done for best results in a particular implementation. Filtering components can be implemented at the input and output if desired as well as between the input and the output.

Referring to FIG. 3, different compensation circuits can be connected to the GSM and the DCS-PCS ports. A simulation should be re-done if using different compensation circuits to assure the best performance for a particular implementation.

Referring to FIGS. 1-3, the coupling port and ballast port resistors power handling capability can be facilitated so that the power dissipation therein is much less than in the main signal path between the input port and the output port. This results in a lower footprint comprising those components.

Referring to FIG. 4, the compensation resistor along with capacitor can be added (as per the basic coupler structure). Series and shunt resistor values can be adjusted if required and they can be placed between input port and inductor as well. It is important to note that the insertion loss between the input port and the output port is higher when the series resistor is higher and the shunt resistor is lower. It should also be noted that the series resistor resistance adds to the series resistance of a coupled inductor, which should be taken into account during simulation. The coupled inductors' parameters can be adjusted, if required. An advantage of this circuit is that when the output port impedance is widely varied, coupling between the input port and the coupling port remains essentially the same. At the same time the impedance variation at the input port is much less than at the output port. The power handling capability of the series resistor should be chosen for maximum RF power transfer between the input port and the output port when the output port is shorted to ground. The power handling capability of the shunt resistor should be chosen for maximum RF power transfer between the input port and the output port when the output port is open (disconnected).

Referring to FIG. 5 the directional coupler block can have different component values from those described above, as is true as well for all of the couplers described herein as will be readily apparent to those skilled in the art. The power detector and control block can have a different architecture as per industry well known solutions.

Referring to FIG. 6 all of the components and compensation circuitry can be adjusted as described above to suit the requirements of a particular implementation.

Figure 7:
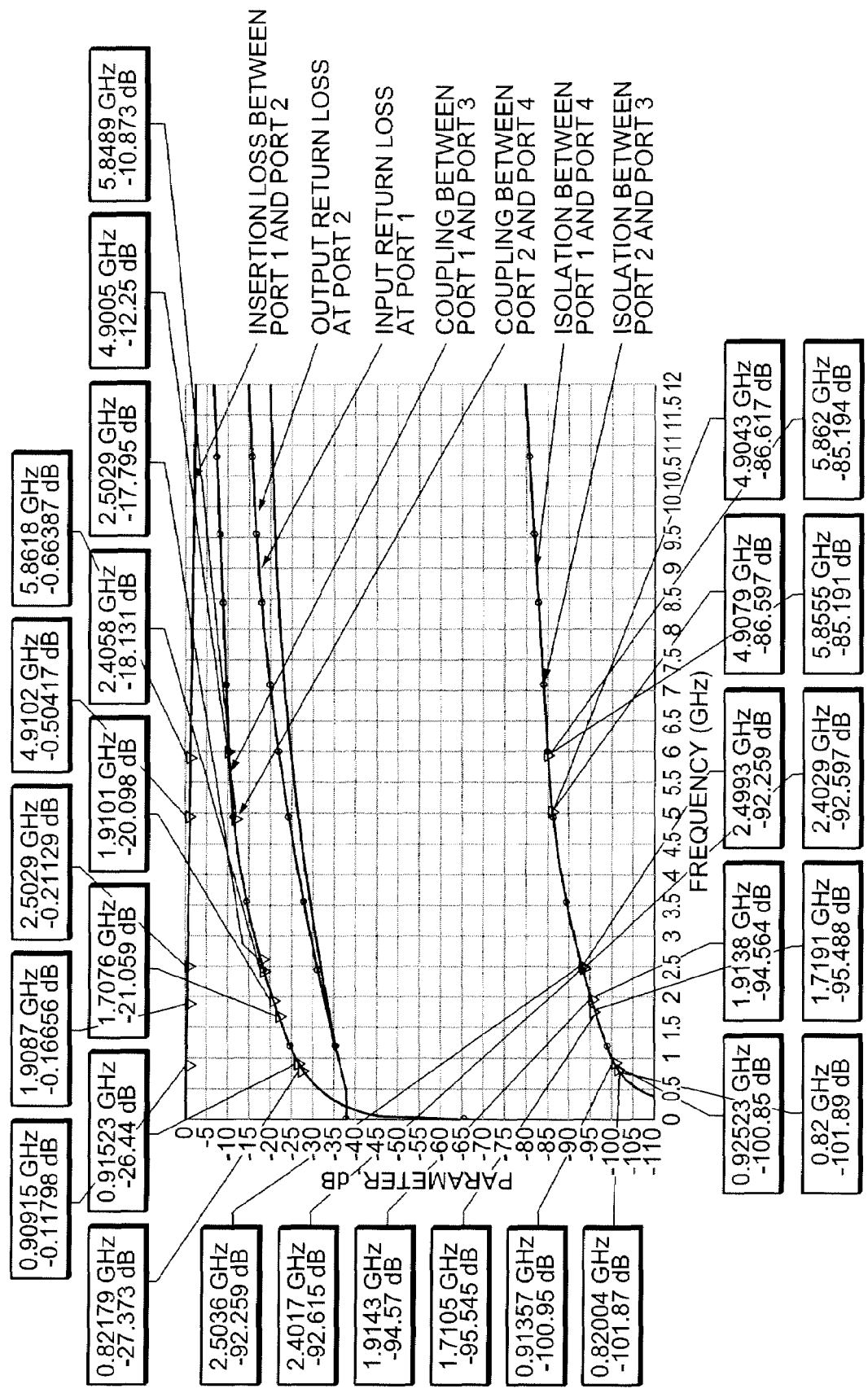
FIG. 7 is a simulation results example for the basic directional coupler parameters over frequency optimized for wideband operation as shown in FIG. 1, wherein the impedance of all ports is 50 ohms.
Figure 8:
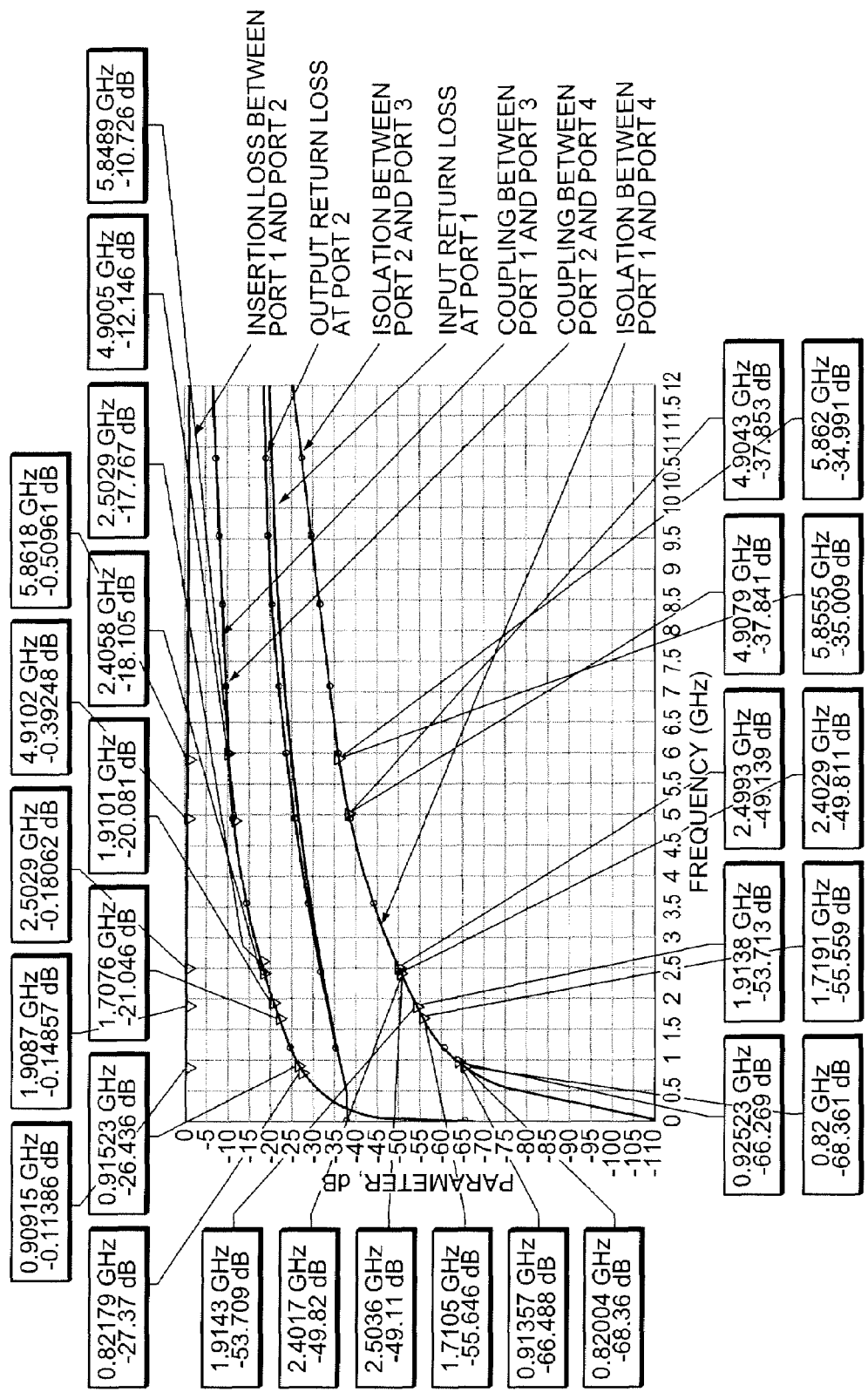
FIG. 8 is a simulation results example for the simplified directional coupler parameters over frequency optimized for wideband operation as shown in FIG. 2, wherein the impedance of all ports is 50 ohms.
Figure 9:
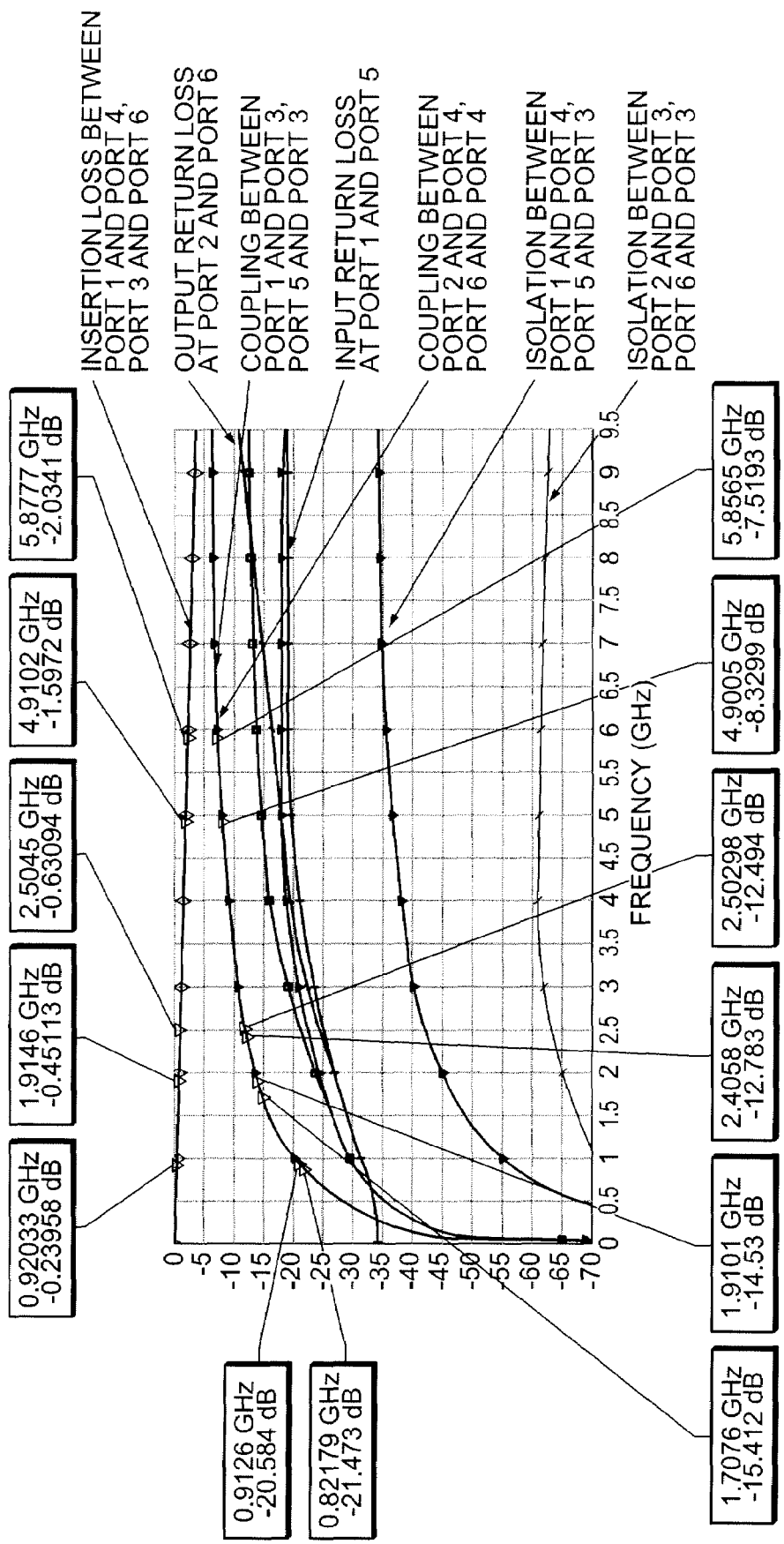
FIG. 9 is a simulation results example for the quad-band GSM directional coupler parameters over frequency optimized for GSM, DCS and PCS band operation as shown in FIG. 3, wherein the impedance of all ports is 50 ohms.
Figure 10:
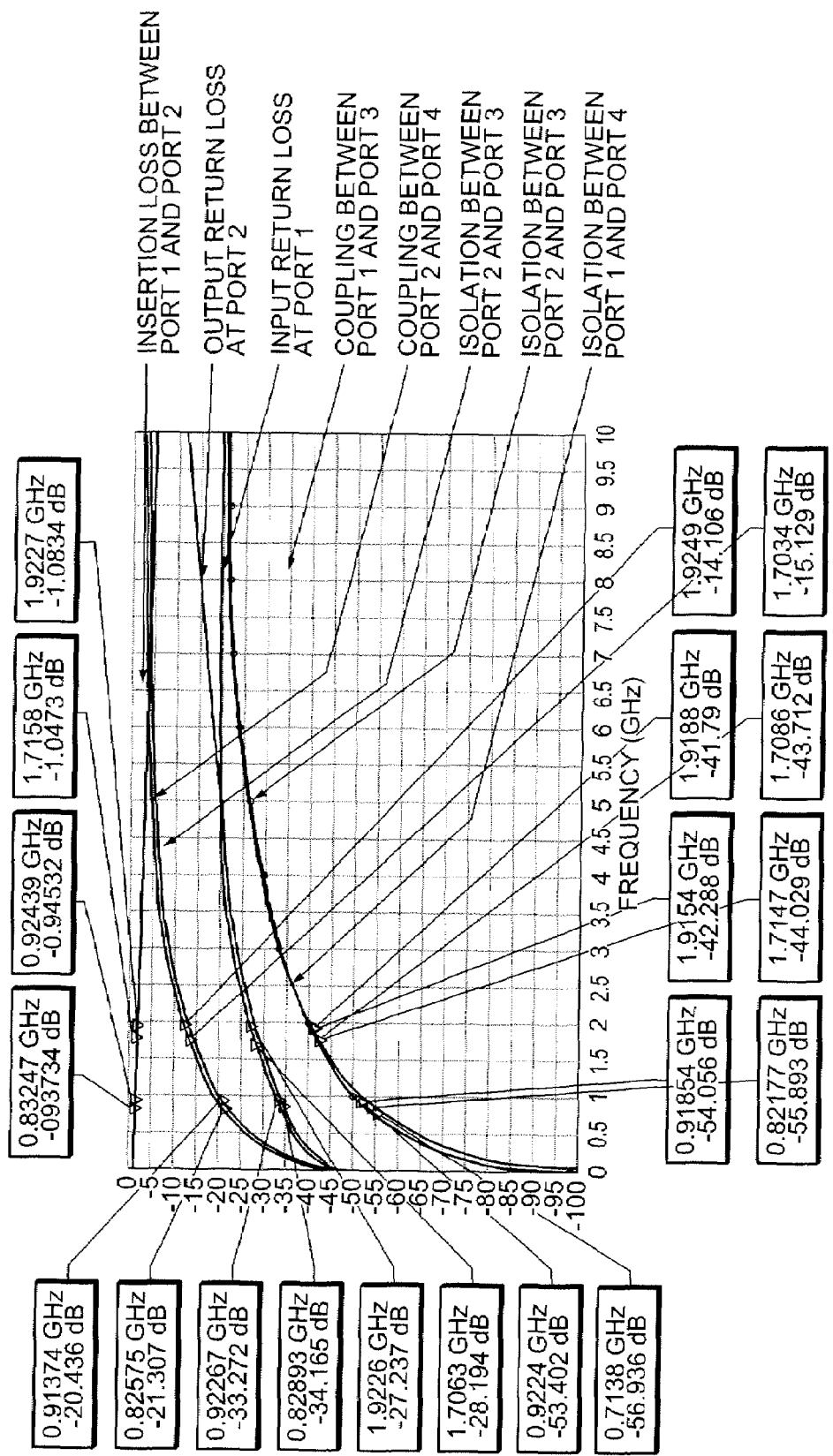
FIG. 10 is a simulation results example for the GSM directional coupler with enhanced load VSWR tolerant capability parameters over frequency optimized for GSM, DCS and PCS band as shown in FIG. 4, wherein the impedance of all ports is 50 ohms.
Figure 11:
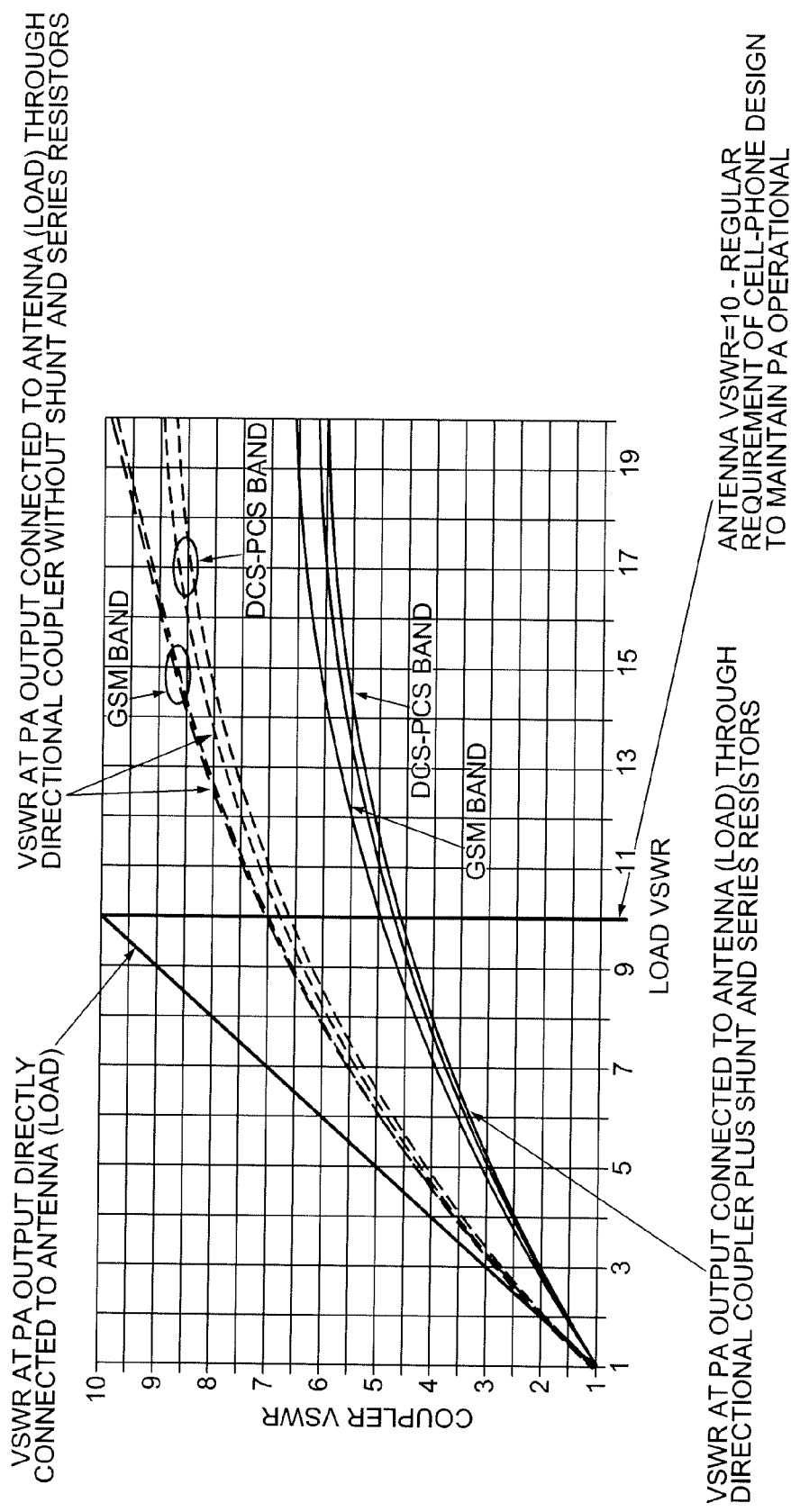
FIG. 11 is a simulation results example of coupler VSWR tolerance over load VSWR variation for the coupler of FIG. 4, wherein the impedance of port 2 is varied.

The performance of the couplers of the present invention using the design methodology described above is set forth in FIGS. 7-11, wherein: FIG. 7 is a simulation results example for the basic directional coupler parameters over frequency optimized for wideband operation as shown in FIG. 1, wherein the impedance of all ports is 50 ohms; FIG. 8 is a simulation results example for the simplified directional coupler parameters over frequency optimized for wideband operation as shown in FIG. 2, wherein the impedance of all ports is 50 ohms; FIG. 9 is a simulation results example for the quad-band GSM directional coupler parameters over frequency optimized for GSM, DCS and PCS band operation as shown in FIG. 3, wherein the impedance of all ports is 50 ohms; FIG. 10 is a simulation results example for the GSM directional coupler with enhanced load VSWR tolerant capability parameters over frequency optimized for GSM, DCS and PCS band as shown in FIG. 4, wherein the impedance of all ports is 50 ohms; and FIG. 11 is a simulation results example of coupler VSWR tolerance over load VSWR variation for the coupler of FIG. 4, wherein the impedance of port 2 is varied.

Figure 12:
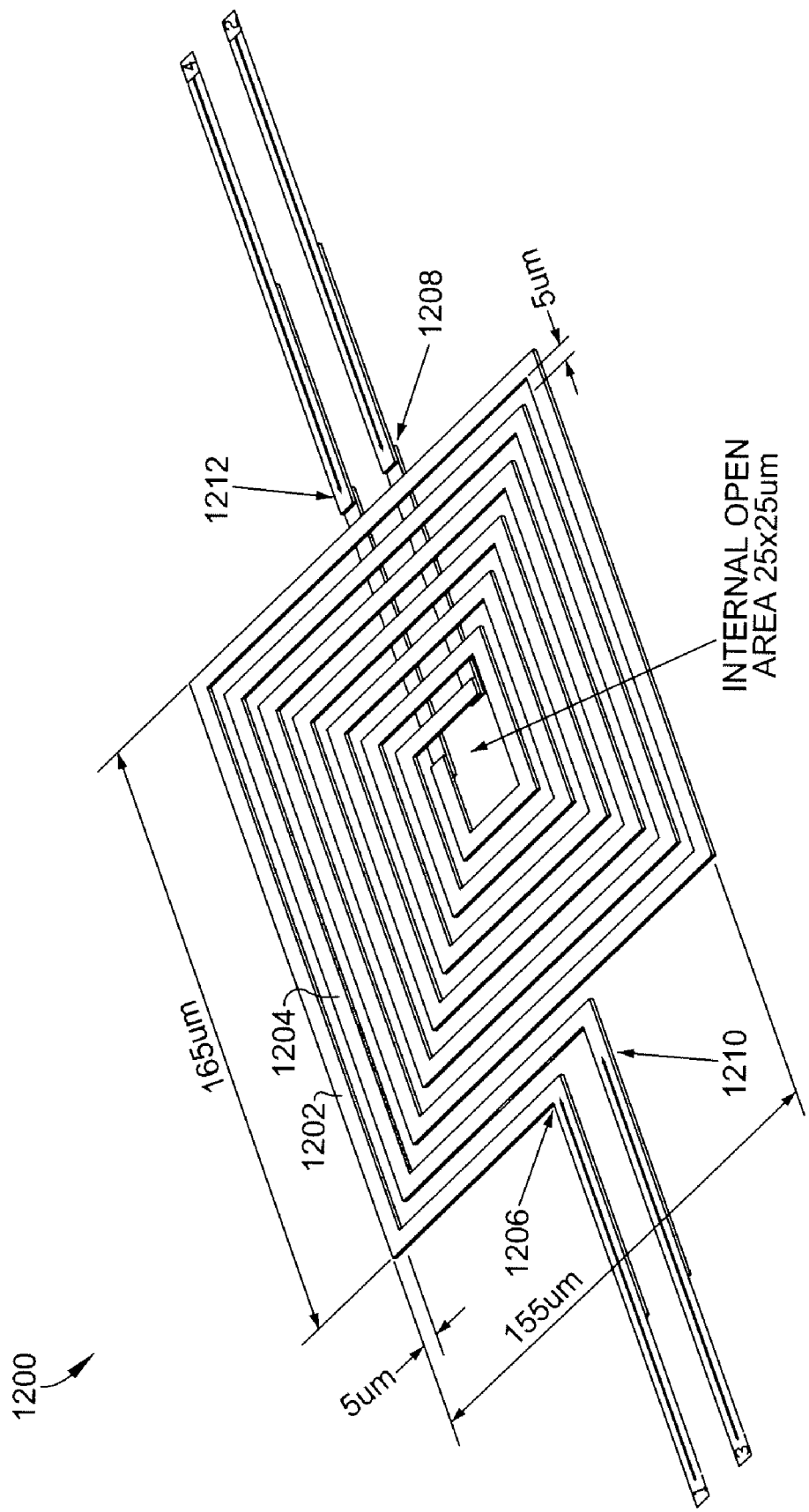
FIG. 12 is a layout diagram of an example of a single-layer coupled inductor according to the present invention.
Figure 13:
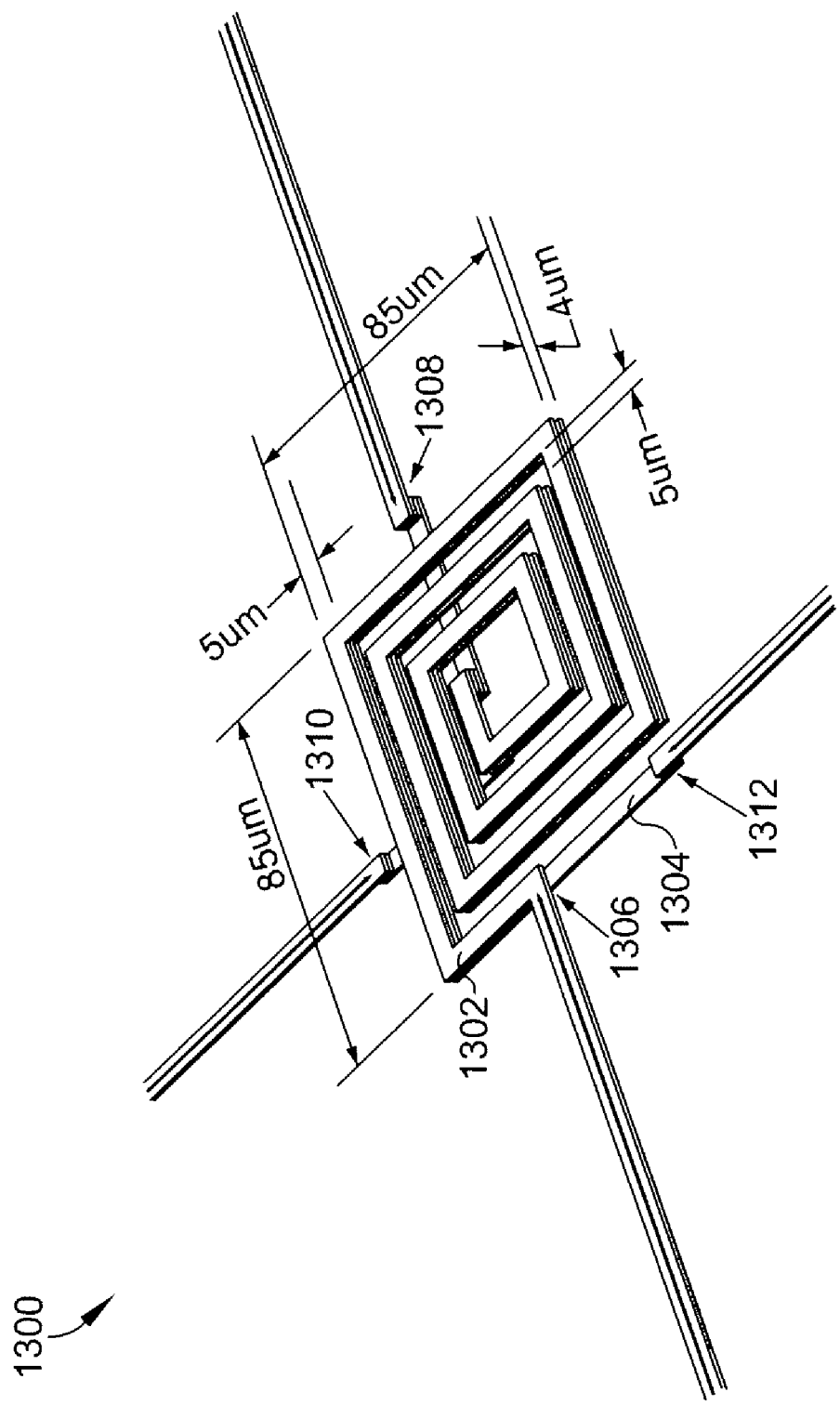
FIG. 13 is a layout diagram of an example of a dual-layer coupled inductor according to the present invention.
Figure 14:
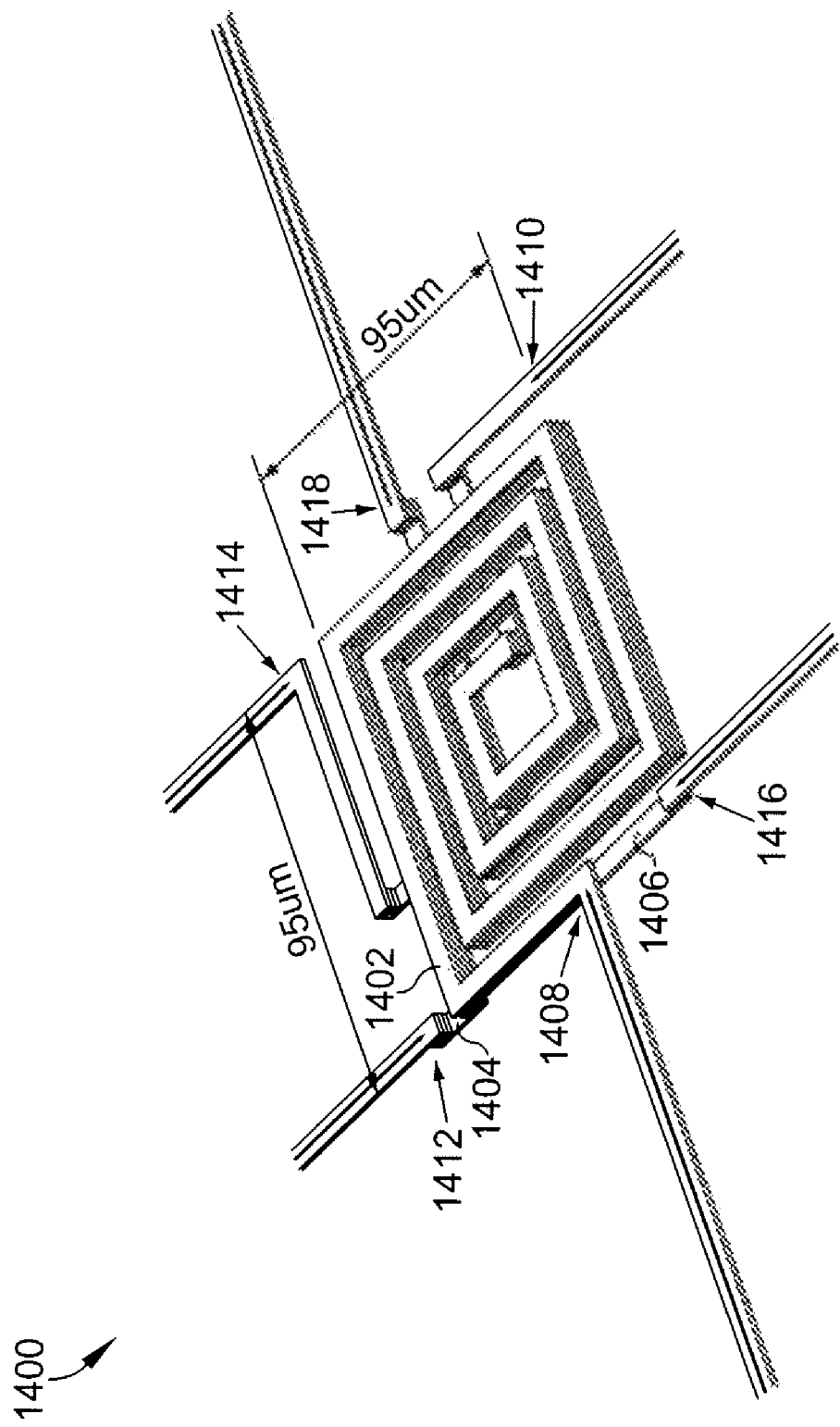
FIG. 14 is a layout diagram of an example of a triple-layer coupled inductor according to the present invention.

Referring generally to FIGS. 12-14, several examples of coupled inductors are shown that are appropriate for achieving the desirably small size for the couplers of the present invention. In general, the small size is possible because the values of the inductance of the coupled inductor, the compensation resistance, and the compensation capacitance are all correspondingly small. Suitable materials for the coupled inductors can include copper, gold, aluminum, and other conductors depending upon the fabrication technology chosen. As described above, the coupled inductors can be fabricated in an integrated circuit, on a printed circuit board, or in low temperature co-fired ceramic implementations, as well as MEMS.

Referring now to FIG. 12 a single-layer coupled inductors layout example is shown as per the GSM coupler of FIG. 4. Coupled inductor 1200 includes first and second inductors 1202, 1204 having four ports 1206, 1208, 1210 and 1212 corresponding to FIG. 4. Metal traces of inductors are made 5 micron wide and 2 micron thick and laying in the same layer on the top of a 100 micron thick substrate, with a dielectric constant of 12.9 and a tangent delta of 0.001 (as per bulk GaAs or similar to Si with high resistivity). Each inductor comprises 3.25 turns of a rectangular shaped coil. Spacing between the metal traces is 5 micron. The internal area is chosen to be 25 by 25 microns. This is the "standard" design rule requirement for low loss and highest inductance (five times metal trace width), although it could be made differently if desired. According to simulation, each inductor 1202, 1204 value is about 1.21-1.22 nH, and the coupling coefficient between inductors is about 0.78. This corresponds to the circuit parameters presented in FIG. 4. Total external footprint of a coupled inductor is about 165 by 155 microns, which is just a bit higher than a "regular" bond pad dimension on an IC (100 by 100 microns). The long metal traces shown in FIG. 12 are for simulation purposes only. The ports shown in accordance with FIG. 4 are positioned at the edges of the rectangular area of 165 by 155 microns. The compensation circuit along with the coupling port and ballast resistance can be designed in a different manner if desired.

Referring now to FIG. 13 a dual-layer coupled inductor layout example is shown as per the wide-band coupler shown in FIGS. 1 and 2. Coupled inductor 1300 includes first 1302 and second 1304 inductors having four ports 1306, 1308, 1310, and 1312 as is shown in FIGS. 1-2. Metal traces of the inductors are made to have a 5 micron width and are laying at different layers. The top metal inductor is 2 microns thick and is separated by 4 microns of an air gap from the second layer metal inductor, which is 1 micron thick. The second layer is positioned on a 100 micron thick substrate with a dielectric constant of 12.9 and a tangent delta of 0.001 (as per bulk GaAs or similar to Si with high resistivity). Each inductor comprises 3.25 turns of a rectangular shaped coil. The spacing between the metal traces at the same layer is 5 microns. The internal area is chosen as 25 by 25 microns, although it can be changed if desired. According to simulation, each inductor 1302, 1304 value is about 0.57-0.58 nH and the coupling coefficient between inductors is about 0.73. This corresponds to circuit parameters presented in FIGS. 1 and 2. The total external footprint of the coupled inductor is 85 by 85 microns, which is less than "regular" bond pad dimension on an IC (100 by 100 microns). The long metal traces shown in FIG. 13 are for simulation purposes only. The four ports shown in accordance with FIGS. 1-2 are positioned at the edges of the rectangular area of 85 by 85 microns. The compensation circuit along with the coupling port and ballast resistance can be designed in a different manner if desired.

Referring now to FIG. 14 a triple-layer coupled inductors layout example is shown as per the quad-band GSM coupler shown in FIG. 3. Coupled inductor 1400 includes first 1402, second 1404 and third 1406 inductors having six ports 1408, 1410, 1412, 1414, 1416, and 1418, as shown in FIG. 3. Metal traces of inductors are made 5 microns wide and laying at different layers. The top metal inductor is 2 microns thick separated by a 4 micron air gap from the second layer metal inductor of 1 micron thickness, the second layer inductor is separated by a 4 micron air gap from the third layer metal inductor of 0.5 um thickness. The second layer is positioned on a 100 micron thick substrate with a dielectric constant of 12.9 and a tangent delta of 0.001 (as per bulk GaAs or similar to Si with high resistivity). Each inductor comprises 3.25 turns of rectangular shaped coil. Spacing between metal traces is 5 microns. The internal area is chosen as 25 by 15 microns. According to simulation each inductor 1402, 1404, 1406, value is about 0.55-0.57 nH and the coupling coefficient between first and second as well as third and second inductors is about 0.7, while the coupling coefficient between first and third inductors is about 0.5. Although this does not fully correspond to the circuit parameters presented in FIG. 3 (it will result in a lower coupling between input ports and coupling port which can be used in real circuits) this structure presents a clear insight as to the dimensions possible. The total external footprint of the coupled inductor is 95 by 95 microns. The long metal traces shown in FIG. 14 are for simulation purposes only. The six ports shown in accordance with FIG. 3 are positioned at the edges of the rectangular area of 95 by 95 microns. Compensation circuits along with the coupling port and the ballast resistance can be designed in a different manner if desired.

GLOSSARY

IC—Integrated Circuit.
GSM—Global System for Mobile Communications.
CDMA—Code Division Multiple Access.
WCDMA—Wideband CDMA.
WLAN—Wireless Local Area Networks.
VSWR—Voltage Standing Wave Ratio.
DCS—Digital Cellular System.
PCS—Personal Communications Service.
Bluetooth—Wireless personal area network standard.
MEMS—Micro Electro-Mechanical System.

Although the present invention has been described with reference to a preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. A radio frequency (RF) directional coupler, comprising:
    a substrate;
    an input port on the substrate;
    a coupling port on the substrate;
    a load port on the substrate;
    a ballast resistor port on the substrate; and
    a coupled inductor on the substrate comprising a first inductor having a first terminal coupled to the input port, a second terminal coupled to the load port, a second inductor having a first terminal coupled to the coupling port and a second terminal coupled to the ballast resistor port, wherein the coupled inductor has a footprint less than about 165 microns by about 155 microns.

2. The RF directional coupler of claim 1, wherein the first inductor comprises about 3.25 turns of rectangular shaped material.

3. The RF directional coupler of claim 2, wherein the rectangular shaped material is about 5 microns wide and about 2 microns thick.

4. The RF directional coupler of claim 1, wherein the substrate comprises at least one of an integrated circuit, a printed circuit board, and a low temperature co-fired ceramic implementation.

5. The RF directional coupler of claim 1, wherein the substrate is about 100 microns thick.

6. The RF directional coupler of claim 1, wherein the first inductor comprises a material selected from the group consisting of gold, copper, and aluminum.

7. The RF directional coupler of claim 1, wherein the first inductor has a dielectric constant of about 12.9.

8. The RF directional coupler of claim 1, wherein the coupled inductor has an internal opening of about 25 microns by about 25 microns.

9. The RF directional coupler of claim 1, wherein a spacing between the first inductor and second inductor is about 5 microns.

10. The RF directional coupler of claim 1, wherein the first inductor is in a substantially stacked relationship over the second inductor forming a dual layer coupled inductor with about a 4 micron air gap between the first inductor and the second inductor.

11. The RF directional coupler of claim 10, wherein the first inductor is about 2 microns thick and the second inductor is about 1 micron thick.

12. The RF directional coupler of claim 10, wherein the coupled inductor has a footprint of about 85 microns by 85 microns.

13. A radio frequency (RF) directional coupler, comprising:
- a substrate;
- a GSM input port on the substrate;
- a power detector port on the substrate;
- a DOS-PCS input port on the substrate;
- a GSM output port on the substrate;
- a ballast resistance port;
- a DCS-PCS output port on the substrate;
- a coupled inductor on the substrate comprising a first inductor having a first terminal coupled to the GSM input port and a second terminal coupled to the GSM output; a second inductor having a first terminal coupled to the power detector port and a second terminal coupled to the ballast resistance port, wherein the second inductor is in a substantially stacked relationship over the first inductor; and a third inductor having a first terminal coupled to the DCS-PCS input port and a second terminal coupled to the DCS-PCS output port, wherein the third inductor is in a substantially stacked relationship over the second inductor.

14. The RF directional coupler of claim 13, wherein the coupled inductor has an internal opening of about 25 microns by 15 microns.

15. The RF directional coupler of claim 13, wherein the first inductor is about 2 microns thick, the second inductor is about 1 micron thick and the third inductor is about 0.5 microns thick.

16. The RF directional coupler of claim 13, wherein the footprint of the coupled inductor is less than about 95 microns by about 95 microns.

17. A radio frequency (RF) directional coupler, comprising:
- a substrate;
- an input port on the substrate;
- a coupling port on the substrate;
- a load port on the substrate;
- a ballast resistor port on the substrate; and
- a coupled inductor on the substrate comprising a first inductor having a first terminal coupled to the input port and a second terminal coupled to the load port; and a second inductor having a first terminal coupled to the coupling port and a second terminal coupled to the ballast resistor port, wherein at least a portion of the first inductor is arranged over the second inductor.

18. The RF directional coupler of claim 17, wherein the first inductor comprises about 3.25 turns of rectangular shaped material.

19. The RF directional coupler of claim 18, wherein a spacing between the first inductor and second inductor is about 5 microns.

20. The RF directional coupler of claim 17, wherein the first inductor and the second inductor comprises a material selected from the group consisting of gold, copper, and aluminum.

* * * * *